(12) United States Patent
Lin et al.

(10) Patent No.: US 7,628,866 B2
(45) Date of Patent: Dec. 8, 2009

(54) METHOD OF CLEANING WAFER AFTER ETCHING PROCESS

(75) Inventors: Miao-Chun Lin, Tainan County (TW); Cheng-Ming Weng, Hsinchu County (TW); Chun-Jen Huang, Tainan County (TW)

(73) Assignee: United Microelectronics Corp., Hsinchu (TW)

( * ) Notice: Subject to any disclaimer, the term of this patent is extended or adjusted under 35 U.S.C. 154(b) by 2 days.

(21) Appl. No.: 11/562,989

(22) Filed: Nov. 23, 2006

(65) Prior Publication Data

US 2008/0121619 A1 May 29, 2008

(51) Int. Cl.
*B08B 3/04* (2006.01)

(52) U.S. Cl. ........... 134/2; 134/3; 134/21; 134/22.1; 134/22.17; 134/25.4; 134/26; 134/28; 134/29; 134/30; 134/36; 134/41; 134/42; 134/902; 216/13; 216/17; 216/41; 216/51; 216/67; 216/72; 216/79; 438/623; 438/700; 438/735; 438/738; 438/906

(58) Field of Classification Search ............ 216/13, 216/17, 41, 51, 67, 72, 79; 438/700, 735, 438/738, 906, 623; 134/2, 3, 21, 22.1, 22.17, 134/25.4, 26, 28, 29, 30, 36, 41, 42, 902
See application file for complete search history.

(56) References Cited

U.S. PATENT DOCUMENTS

| | | | |
|---|---|---|---|
| 6,107,192 A * | 8/2000 | Subrahmanyan et al. | 438/637 |
| 6,461,529 B1 | 10/2002 | Boyd et al. | |
| 6,524,936 B2 * | 2/2003 | Hallock et al. | 438/531 |
| 6,638,855 B1 * | 10/2003 | Chang et al. | 438/637 |
| 2002/0058397 A1 * | 5/2002 | Smith et al. | 438/475 |
| 2005/0239286 A1 * | 10/2005 | Wu et al. | 438/637 |
| 2005/0245074 A1 * | 11/2005 | Jiang et al. | 438/637 |
| 2006/0063376 A1 * | 3/2006 | Lee et al. | 438/638 |
| 2007/0175861 A1 * | 8/2007 | Hwang et al. | 216/67 |
| 2007/0238302 A1 * | 10/2007 | Dip et al. | 438/706 |

* cited by examiner

*Primary Examiner*—Sharidan Carrillo
(74) *Attorney, Agent, or Firm*—Jianq Chyun IP Office

(57) ABSTRACT

A method of cleaning a wafer after an etching process is provided. A substrate having an etching stop layer, a dielectric layer, a patterned metal hard mask sequentially formed thereon is provided. Using the patterned metal hard mask, an opening is defined in the dielectric layer. The opening exposes a portion of the etching stop layer. A dry etching process is performed in the environment of helium to remove the etching stop layer exposed by the opening. A dry cleaning process is performed on the wafer surface using a mixture of nitrogen and hydrogen as the reactive gases. A wet cleaning process is performed on the wafer surface using a cleaning solution containing a trace amount of hydrofluoric acid.

14 Claims, 2 Drawing Sheets

METHOD OF CLEANING WAFER AFTER ETCHING PROCESS

BACKGROUND OF THE INVENTION

1. Field of the Invention

The present invention relates to a method of cleaning a wafer. More particularly, the present invention relates to a method of cleaning a wafer after an etching process.

2. Description of the Related Art

Damascene process is a meticulous technique for embedding metallic interconnection inside an insulation layer. The method includes etching a dielectric layer on a substrate to form a plurality of trenches and via openings according to the required metallic line pattern and the locations of vias. Then, a metallic layer is deposited on the substrate to fill up the trenches and the openings so that the metallic lines and the vias are simultaneously formed. Because using the dual damascene process can prevent overlay errors and process deviation problems that result from the typical process of forming a via before forming a metallic conducting wire in a photolithographic process, the device has a higher reliability and the processing capability is increased. Therefore, with the demand for a higher level of integration, dual damascene process has gradually become a widely adopted fabricating technique in semiconductor industry.

However, a mask layer fabricated from metallic material such as titanium nitride is often used as an etching mask in the process of etching the dielectric layer to form trenches and via openings. The etching gas includes $C_xF_y$ compounds, and the $C_xF_y$ compounds are bonding to form the long carbon chain polymer during the etching process. The long carbon chain polymer or the polymer formed between the long carbon chain polymer and the metallic ions freed from plasma bombardment and other reactive gases or photoresist material will be deposited on the wafer surface. In addition, after the etching process, the residual fluorine will attach to the wafer surface and react with the metallic ions within the metallic mask layer to form metallic fluorides such as titanium fluoride. These residual materials such as the polymers and the metallic fluorides may produce some adverse effects on the electrical properties of the device leading to a drop in device performance. Thus, there is a need to remove the polymers and metallic fluorides after the etching process.

A conventional technique for removing these polymers is a three-stage cleaning process that includes performing a wet cleaning, a dry cleaning and a wet cleaning processes in sequence. The first wet cleaning process is carried out to soften the polymers and detach the polymers from the wafer surface. The dry etching process is carried out to miniaturize the polymers. Finally, the second wet cleaning process is carried out to remove the remaining polymers.

Yet, the cleaning solution in the wet cleaning processes is mostly an alkaline solution that will cause some damage to the metallic layer in the substrate exposed by the openings.

Moreover, the performance of the aforementioned method of removing the polymers is poor at removing metallic fluorides from the wafer. Therefore, some residual metallic fluoride will still remain on the wafer after performing the polymer removing process and consequently produce some adverse effects on the device.

In addition, the three-stage cleaning process for removing polymers on the wafer is rather complicated. Ultimately, this will affect productivity.

SUMMARY OF THE INVENTION

Accordingly, at least one objective of the present invention is to provide a method of cleaning a wafer so that polymers and metallic fluorides can be effectively removed from the wafer surface after an etching process.

At least another objective of the present invention is to provide a method of cleaning a wafer after an etching process, capable of preventing any residual material such as polymers and metal fluorides from adversely affecting the electrical properties of the device. As a result, the performance of the device can be improved.

To achieve These and other advantages and in accordance with the purpose of The invention, as embodied and broadly described herein, the invention provides a method of cleaning a wafer after an etching process. First, a substrate having an etching stop layer, a dielectric layer and a patterned metal hard mask sequentially formed Thereon is provided. Using the patterned metal hard mask, an opening is defined in the dielectric layer. The opening exposes a portion of the etching stop layer. Then, a dry etching process is performed in the environment of helium to remove the etching stop layer exposed by the opening. Next, a dry cleaning process is performed on the wafer surface using a mixture of nitrogen and hydrogen as the reactive gases. Then, a wet cleaning process is performed on the wafer surface using a cleaning solution containing a trace amount of hydrofluoric acid.

In the aforementioned method of cleaning the wafer after an etching process in one preferred embodiment of the present invention, the gas flow rate of helium passing into the reaction chamber for performing the dry etching process is between 100~500 sccm.

In the aforementioned method of cleaning the wafer after an etching process in one preferred embodiment of the present invention, the reactive gas in performing the dry etching process includes a fluorine-containing gas, for example.

In the aforementioned method of cleaning the wafer after an etching process m one preferred embodiment of the present invention., the fluorine-containing gas is one gas or a mixture of two or more gases selected from a group consisting of carbon tetrachloride ($CF_4$), ethyl-hexafluoride ($C_2F_6$), propyl-octafluoride ($C_3F_8$), butyl-octafluoride ($C_4F_8$), pentyl-octafluoride ($C_5F_8$), methyl-trifluoride ($CUE_3$), for example.

In the aforementioned method of cleaning the wafer after an etching process in one preferred embodiment of the present invention, the gas flow rate of hydrogen is greater than the gas flow rate of nitrogen in the dry cleaning process.

In the aforementioned method of cleaning the wafer after an etching process in one preferred embodiment of the present invention, the gas flow rate of the hydrogen is between about 400~1200 sccm.

In the aforementioned method of cleaning the wafer after an etching process in one preferred embodiment of the present invention, the gas flow rate of the nitrogen is between about 200~600 sccm.

In the aforementioned method of cleaning the wafer after an etching process in one preferred embodiment of the present invention, the cleaning solution is an acid solution or an alkaline solution, for example.

In the aforementioned method of cleaning the wafer alter an etching process m one preferred embodiment of the present invention, the acid solution includes an organic acid solution, an inorganic acid solution or a solution mixture of organic acid and inorganic acid, for example.

In the aforementioned method of cleaning the wafer after an etching process m one preferred embodiment of the present invention, the inorganic acid solution is a solution or a mixture containing two or more solutions selected from a group consisting of sulfuric acid, hydrochloric acid, phosphoric acid or nitric acid.

In the aforementioned method of cleaning the wafer alter an etching process in one preferred embodiment of the present invention, the alkaline solution is an ammonia-containing solution, for example.

In the aforementioned method of cleaning the wafer after an etching process in one preferred embodiment of the present invention, the dry cleaning process is performed in-situ after the dry etching process.

In the aforementioned method of cleaning the wafer after an etching process in one preferred embodiment of the present invention, the material constituting the patterned metal hard mask includes titanium nitride, tantalum nitride, titanium or tantalum, for example.

In the aforementioned method of cleaning the wafer after an etching process in one preferred embodiment of the present invention, the openings include trenches and via openings.

The present invention also provides an alternative method of cleaning the wafer after an etching process. First, a substrate having a dielectric layer, a patterned metal hard mask sequentially formed thereon is provided. Using the patterned metal hard mask, an opening is defined in the dielectric layer. Then, a dry cleaning process is performed on the wafer surface using a mixture of nitrogen and hydrogen as the reactive gases. Next, a wet cleaning process is performed on the wafer surface using a cleaning solution containing a trace amount of hydrofluoric acid.

The wafer cleaning process after an etching process in the present invention includes washing the surface of the wafer with a cleaning solution containing a trace amount of hydrofluoric acid so that any polymers or metal fluorides deposited on the wafer surface can be effectively removed. As a result, residual material such as polymers and metal fluorides is prevented from affecting the electrical properties of the device. In other words, the device has a better performance.

Moreover, in the wet cleaning process, using an acid solution to serve as a cleaning solution can prevent the cleaning solution from damaging the metallic layer in the substrate exposed by the opening.

In addition, the wafer cleaning process provided by the present invention is a dry cleaning/wet cleaning two-stage process so that the production cycle is shortened compared with the conventional three-stage process. Hence, overall productivity is improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
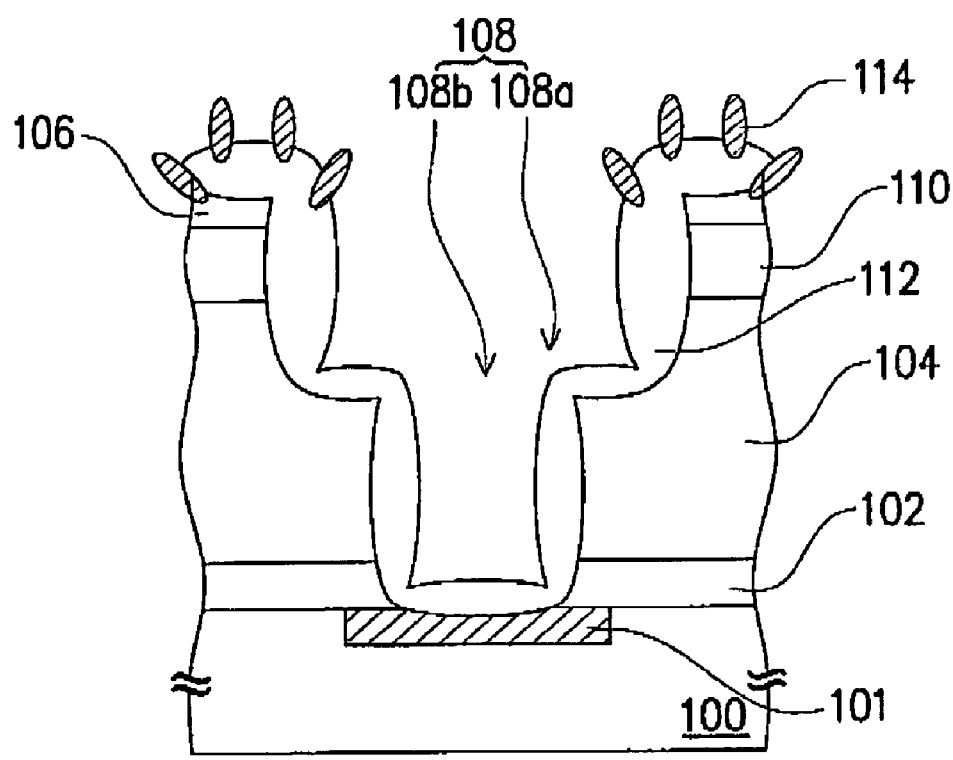
FIGS. 1A and 1B are schematic cross-sectional views showing the steps for cleaning a wafer after an etching process.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
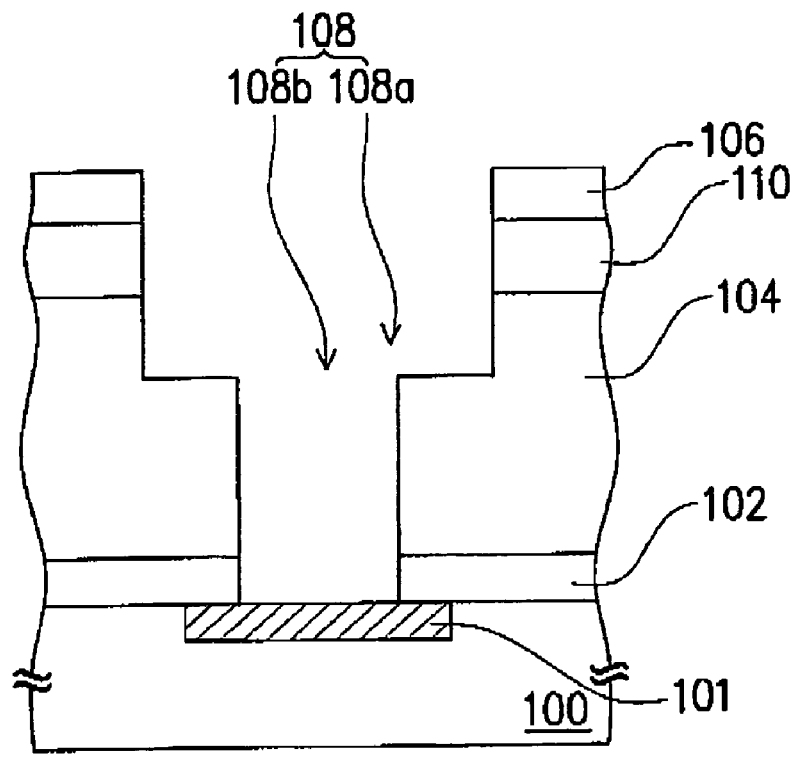

FIGS. 1A and 1B are schematic cross-sectional views showing the steps for cleaning a wafer after an etching process. As shown in FIG. 1A, a substrate 100 is provided. The substrate has a metallic layer 101 therein to be a conducting wire or an electrode, for example. The substrate 100 has an etching stop layer 102, a dielectric layer 104 and a patterned metal hard mask 106 sequentially formed thereon. Using the patterned metal hard mask 106, an opening 108 that exposes a portion of the etching stop layer 102 is defined in the dielectric layer 104. The substrate 100 is a silicon substrate, for example. The etching stop layer 102 is fabricated using silicon-nitrogen carbide, silicon nitride or other suitable material, for example. The dielectric layer 104 is fabricated using a low dielectric constant material including fluorinated amorphous carbon, carbon-doped oxide, Parylene AF4, PAE or Cyclotene, for example. The patterned metal hard mask 106 is fabricated using titanium nitride, tantalum nitride, titanium or tantalum, for example. The opening 108 comprises a trench 108a and a via opening 108b, for example, but is not limited as such in the present invention. Furthermore, an oxide layer 110 may also form between the dielectric layer 104 and the patterned metal hard mask 106. The oxide layer 110 is a silicon oxide layer formed, for example, using tetra-ethyl-ortho-silicate (TEOS) as the reactive gas. Since the method for forming the aforementioned etching stop layer 102, dielectric layer 104, the patterned metal hard mask 106 and the oxide layer 110 should be familiar to those skilled in this field, the detailed description is omitted here.

Next, under the environment surrounded by helium, a dry etching process is carried out inside a reaction chamber to remove the exposed etching stop layer 102 and expose the metallic layer 101 in the substrate 100. In the dry etching process, the flaw of helium gas into the reaction chamber is about 100~500 sccm. The reactive gas used in the dry etching process can be a fluoride gas or a mixture containing two or more fluoride gases selected from the group consisting of $CF_4$, $C_2F_6$, $C_3F_8$, $C_4F_8$, $C_5F_8$ and $CHF_3$, for example. The gas flow rate of the fluoride gas is about 150 sccm, for example.

In the process of forming the opening 108, the long carbon chain polymers in the etching gas or the polymers 112 fanned by the long carbon chain polymers reacting with metallic ions bombarded out by plasma and other reactive gases will deposit on the surface of the wafer. In addition, at the end of the etching process, residual fluorides will attach to the wafer surface and react with the metallic ions in the patterned metal hard mask 106 to form metal fluorides 114 such as titanium fluorides.

Because helium serving as a carry gas is also passed into the reaction chamber to carry away fluorides in the dry etching process for removing the exposed etching stop layer 102, the amount of residual fluorides attached to the wafer surface is significantly reduced. Therefore, the amount of metal fluorides 114 resulting from the reaction between die fluorides and the metallic ions in the patterned metal hard mask 106 is greatly reduced or even avoided.

As shown in FIG. 1B, using a nitrogen and hydrogen mixture as a reactive gas, a dry cleaning process of the wafer surface is performed to soften the polymers 112 and remove a portion of the polymers 112. The dry cleaning process is an in-situ process performed after the dry etching process. In other words, the dry cleaning process is carried out without destroying the vacuum environment. In the dry cleaning process, the gas flow rate of hydrogen is greater than that of the nitrogen. The ratio of the gas flow rate between the hydrogen and the nitrogen is around 2:1, for example. The gas flow rate of hydrogen is around 400~1200 sccm and the gas flow rate of nitrogen is around 200~600 sccm, for example.

After that, a wet cleaning process of the wafer surface using a cleaning solution with a small trace amount of hydrofluoric acid is carried out. The cleaning solution is an acid solution pr an alkaline solution, for example. The acid solution is an organic acid solution, an-inorganic acid solution or a solution mixture containing organic acid solution and an inorganic acid solution, for example. The inorganic acid solution is an acid solution or a solution mixture containing two or more acid solutions selected from a group consisting of sulfuric acid, hydrochloric acid solution, phosphoric acid and nitric acid, for example. The alkaline solution is an ammonia-containing solution, for example. It should be noted that although both acid solution and alkaline solution can be used as a cleaning solution, the acid solution is the preferred cleaning solution because alkaline solution will damage the metallic layer 101 in the substrate 100.

Because the cleaning solution contains a minute amount of hydrofluoric acid, the metal fluorides 114 can also be removed beside the polymer 112. Therefore, after performing the etching process, no more residual materials such polymers 112 and metal fluorides 114 are deposited on the wafer to affect the profile and electrical properties of the device. Moreover, the post-etching cleaning operation in the present invention is a dry cleaning/wet cleaning two-stage cleaning process instead of the conventional three-stage cleaning process. As a result, the processing cycle is reduced and the productivity is increased.

Figure 2:
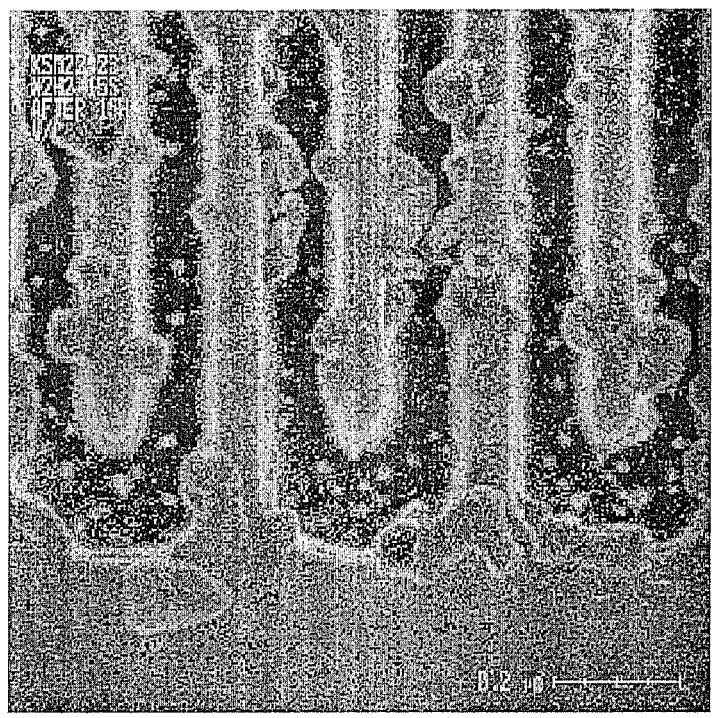
FIG. 2 is a photo showing the surface profile after performing a conventional etching process on an etching stop layer.
Figure 3:
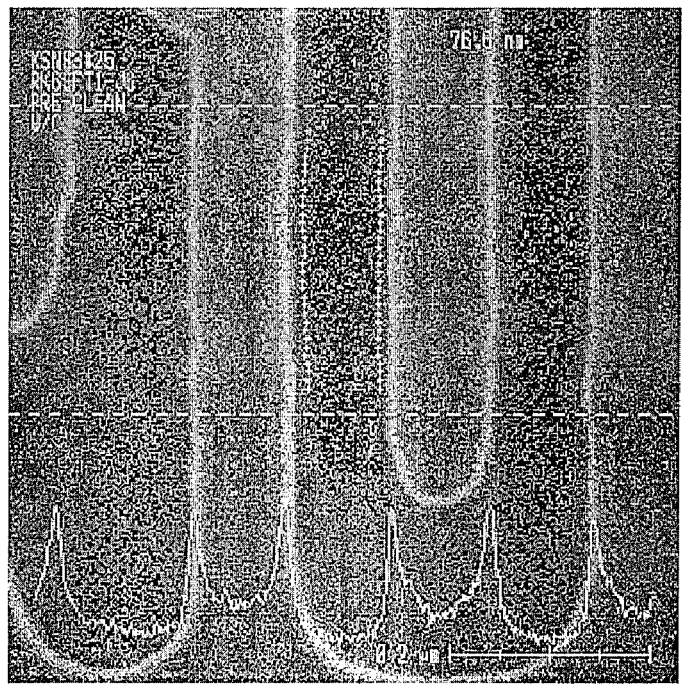
FIG. 3 is a photo showing the surface profile after performing an etching process on an etching stop layer according to the present invention.

FIG. 2 is a photo showing the surface profile after performing a conventional etching process on an etching stop layer. FIG. 3 is a photo showing the surface profile after performing an etching process on an etching stop layer according to the present invention. As shown in FIG. 2, without passing any helium into the reaction chamber in the conventional process of etching the etching stop layer, a layer of residual fluorides is deposit on the wafer surface. The residual fluorides subsequently react with the metal in the metal hard mask to form metallic fluorides. Hence, a large number of protruding objects formed from metal fluorides can be seen studded the surface of the wafer in FIG. 2.

As shown in FIG. 3, helium is passed into the reaction chamber to serve as a carry gas for carrying any fluoride away in the process of etching the etching stop layer in the present invention. Hence, fewer residual fluorides are attached to the wafer surface and fewer or none of metal fluorides resulting from the reaction between the fluorides and the metallic ions in the metallic mask layer are formed. As a result, the wafer is virtually free of any protruding objects so that a rather smooth cross-sectional profile can be seen in FIG. 3.

In summary, major advantages of the present invention at least include:
1. The wafer cleaning process after an etching process in the present invention includes washing the surface of the water with a cleaning solution containing a trace amount of hydrofluoric acid. Hence, polymers or metal fluorides deposited on the wafer surface are effectively removed.
2. The past-etching cleaning process in the present invention can prevent residual material such as polymers and metal fluorides from affecting the electrical properties of the device. Hence, the device can have a better performance.
3. In the wet cleaning process, if an acid solution is used as the cleaning solution, the cleaning process will not damage the metallic layer in the substrate exposed by the opening.
4. The post-etching wafer cleaning process in the present invention is a dry cleaning/wet cleaning two-stage process. Hence, the production cycle is shortened and overall productivity is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of cleaning a wafer after an etching process for forming an opening, comprising the steps of:

providing a wafer, wherein the wafer has an etching stop layer, a dielectric layer and a patterned metal hard mask sequentially formed thereon, and the patterned metal hard mask is used to define the opening in the dielectric layer such that the opening exposes a portion of the etching stop layer;

performing a dry etching process inside a reaction chamber with an environment of helium to remove the etching stop layer exposed by the opening, wherein a polymer and a metal fluoride formed from the patterned metal hard mask in the dry etching process are both deposited on the wafer;

performing a dry cleaning process to soften the polymer and to remove a portion of the polymer deposited on the wafer using a gaseous mixture of hydrogen and nitrogen as a reactive gas, after the dry etching process; and performing a wet cleaning process to remove the polymer and the metal fluoride deposited on the wafer using hydrofluoric acid after the dry cleaning process, wherein the patterned metal hard mask remains on the wafer after the wet cleaning process.

2. The cleaning method of claim 1, wherein a gas flow rate of helium in the dry etching process is between about 100~500 sccm.

3. The cleaning method of claim 1, wherein a reactive gas in the dry etching process includes a fluorine-containing gas.

4. The cleaning method of claim 1, wherein a gas flow rate of hydrogen in the dry cleaning process is greater than a gas flow rate of nitrogen.

5. The cleaning method of claim 1, wherein the dry cleaning process is performed in-situ after the dry etching process.

6. The cleaning method of claim 1, wherein a material constituting the patterned metal hard mask includes titanium nitride, tantalum nitride, titanium or tantalum.

7. The cleaning method of claim 1, wherein the opening comprises a trench and a via opening.

8. The cleaning method of claim 3, wherein the fluorine-containing gas is a gas or a mixture of gases selected from the group consisting of $CF_4$, $C_2F_6$, $C_3F_8$, $C_4F_8$, $C_5F_8$ and $CHF_3$.

9. The cleaning method of claim 4, wherein the gas flow rate of hydrogen is between about 400~1200 sccm.

10. The cleaning method of claim 4, wherein the gas flow rate of nitrogen is between about 200~600 sccm.

11. A method of cleaning a wafer after an etching process for forming an opening, comprising the steps of:

providing a wafer, wherein the wafer has a dielectric layer and a patterned metal hard mask sequentially formed thereon, and the patterned metal hard mask is used to define the opening in the dielectric layer, wherein a polymer and a metal fluoride formed from the patterned metal hard mask in a dry etching process are both deposited on the wafer;

performing a dry cleaning process to soften the polymer and to remove a portion of the polymer deposited on the wafer using a gaseous mixture of hydrogen and nitrogen as a reactive gas, wherein the dry cleaning process is performed in-situ after the dry etching process; and performing a wet cleaning process to remove the polymer and the metal fluoride deposited on the wafer using a cleaning solution containing hydrofluoric acid after the dry cleaning process, wherein the patterned metal hard mask remains on the wafer after the wet cleaning process.

12. The cleaning method of claim 11, wherein a gas flow rate of hydrogen in the dry cleaning process is greater than a gas flow rate of nitrogen.

13. The cleaning method of claim 11, wherein a material constituting the patterned metal hard mask includes titanium nitride, tantalum nitride, titanium or tantalum.

14. The cleaning method of claim 11, wherein the opening comprises a trench.

* * * * *